(12) United States Patent
Hansen et al.

(10) Patent No.: US 8,654,832 B1
(45) Date of Patent: Feb. 18, 2014

(54) APPARATUS AND METHOD FOR CODING AND MODULATION

(75) Inventors: Christian Hansen, Niedersachsen (DE); Ingolf Wassermann, Hannover (DE)

(73) Assignee: Baker Hughes Incorporated, Houston, TX (US)

( * ) Notice: Subject to any disclaimer, the term of this patent is extended or adjusted under 35 U.S.C. 154(b) by 0 days.

(21) Appl. No.: 13/610,243

(22) Filed: Sep. 11, 2012

(51) Int. Cl.
*H03K 7/04* (2006.01)
*H03K 9/04* (2006.01)
*H03K 9/08* (2006.01)

(52) U.S. Cl.
USPC ........... 375/239; 375/237; 375/238; 375/265; 367/81; 367/86

(58) Field of Classification Search
USPC ......... 375/237–239, 242–254, 265, 272, 273, 375/279, 303, 308; 367/81–86
See application file for complete search history.

(56) References Cited

U.S. PATENT DOCUMENTS

| 3,898,589 | A | 8/1975 | Tustison |
| 6,201,836 | B1 * | 3/2001 | Kim ............................. 375/265 |
| 7,250,873 | B2 | 7/2007 | Hahn et al. |
| 7,636,397 | B2 | 12/2009 | McLaughlin |
| 2003/0011489 | A1 | 1/2003 | Viswanathan |
| 2005/0018786 | A1 * | 1/2005 | Parhi et al. ..................... 375/265 |
| 2008/0019460 | A1 | 1/2008 | Giles et al. |
| 2009/0036064 | A1 | 2/2009 | Ravi et al. |
| 2009/0041108 | A1 | 2/2009 | Degani et al. |
| 2011/0142093 | A1 | 6/2011 | De Rosa |

FOREIGN PATENT DOCUMENTS

| EP | 1475898 | 11/2004 |
| WO | 03065671 A1 | 8/2003 |
| WO | 2009023533 A1 | 2/2009 |
| WO | 2012027633 | 3/2012 |

OTHER PUBLICATIONS

S. S. Pietrobon et al, "Trellis-Coded Multidimensional Phase Modulation", IEEE Transactions on Information Theory, vol. 36, No. 1, Jan. 1990. pp. 63-89.
G. Ungerboeck, "Adaptive Maximum Likelihood Receiver for Carrier-Modulated Data-Transmission Systems", IEEE Trans. Commun., vol. 22, pp. 624-636, May 1974.
Georghiades, some implication of TCM for optical direct-detection channels, May 1989, Retrieved from the Internet:, URL: http://ieeexplore.ieee.org/xpl/articleDetails.jsp?tp=&arnumber=24599&contentType=Journals+%26+Magazines&queryText%3DSome+implications+of+TCM+for+optical+direct-detection+channels.
Ungerboeck, Gottfried, "Trellis-Coded Modulation with Redundant Signal Sets Part 1: Introduction". IEEE Communications Magazine, Feb. 1987-vol. 25, No. 2. pp. 5-21.

(Continued)

*Primary Examiner* — Curtis Odom
(74) *Attorney, Agent, or Firm* — Cantor Colburn LLP (57) ABSTRACT

A communication method includes: receiving input data at a transmitter, the transmitter including at least one convolutional encoder and at least one modulator; applying the input data to a trellis-coded modulation (TCM) scheme to encode the input data and produce one or more TCM symbols representing the encoded data; applying the one or more TCM symbols to a second modulation scheme, the second modulation scheme including a pulse modulation in combination with an additional modulation; and generating one or more modulation symbols representing the encoded data based on the second modulation scheme.

20 Claims, 6 Drawing Sheets

(56) References Cited

OTHER PUBLICATIONS

Choi, Jae-Hoon, Multicarrier-Based QAPM Modulation System for the low power consumption and high data rates, Mobile networks and applications, vol. 17 No. 1, Apr. 5, 2011.

K. Kiasaleh et al., T-PPM: A Novel Modulation Scheme for Optical Comm. Systems Impaired by Pulse-Width Inaccuracies, Nov. 15, 1998.

Yu, Limin et al., Design of Complex Wavelet Pulses Enabling PSK Modulation for UWB Impulse Radio Communications, AusWireless '06 : 1st International Conference, Mar. 13-16, 2006, Sydney.

Tae-Jin Lee et al., A Study on the Low Power Communication for Underwater Sensor Network, 2011 Retrieved from the Internet:, URL: www.computer.org/csdl/proceedings/euc/2011/4552/00/4552a430-abs.html.

* cited by examiner

Fast table

| Parity | None | | Even | | Odd | |
|---|---|---|---|---|---|---|
| # of bits | M | N | M | N | M | N |
| 1 | 1 | 4 | 1 | 6 | 1 | 5 |
| 2 | 1 | 6 | 2 | 9 | 2 | 8 |
| 3 | 2 | 9 | 2 | 11 | 2 | 10 |
| 4 | 2 | 11 | 2 | 13 | 2 | 12 |
| 5 | 2 | 13 | 3 | 15 | 3 | 15 |
| 6 | 5 | 15 | 3 | 17 | 3 | 17 |
| 7 | 3 | 17 | 3 | 19 | 3 | 19 |
| 8 | 3 | 19 | 4 | 21 | 4 | 21 |
| 9 | 4 | 21 | 4 | 23 | 4 | 23 |
| 10 | 4 | 23 | 4 | 25 | 4 | 25 |
| 11 | 4 | 25 | 5 | 26 | 5 | 26 |
| 12 | 5 | 26 | 5 | 28 | 5 | 28 |
| 13 | 5 | 28 | 6 | 30 | 6 | 30 |
| 14 | 6 | 30 | 6 | 32 | 6 | 32 |
| 15 | 6 | 32 | 6 | 34 | 6 | 34 |
| 16 | 6 | 34 | 6 | 36 | 6 | 36 |

Slow table

| Parity | None | | Even | | Odd | |
|---|---|---|---|---|---|---|
| # of bits | M | N | M | N | M | N |
| 1 | 1 | 4 | 1 | 6 | 1 | 5 |
| 2 | 1 | 6 | 1 | 10 | 1 | 9 |
| 3 | 1 | 10 | 2 | 11 | 2 | 10 |
| 4 | 2 | 11 | 2 | 13 | 2 | 12 |
| 5 | 2 | 13 | 3 | 15 | 2 | 16 |
| 6 | 2 | 16 | 3 | 17 | 3 | 17 |
| 7 | 3 | 17 | 3 | 19 | 3 | 19 |
| 8 | 3 | 19 | 3 | 22 | 3 | 22 |
| 9 | 3 | 22 | 4 | 23 | 4 | 23 |
| 10 | 4 | 23 | 4 | 25 | 4 | 25 |
| 11 | 4 | 25 | 4 | 28 | 4 | 28 |
| 12 | 4 | 28 | 5 | 28 | 5 | 28 |
| 13 | 5 | 28 | 5 | 31 | 5 | 31 |
| 14 | 5 | 31 | 5 | 33 | 5 | 33 |
| 15 | 5 | 33 | 5 | 36 | 5 | 36 |
| 16 | 6 | 36 | 6 | 36 | 6 | 36 |

APPARATUS AND METHOD FOR CODING AND MODULATION

BACKGROUND

Cable bound telemetry systems are means of bi-directional transmission of information between the surface and downhole components. Information is typically transmitted over a cable via a carrier wave that is modulated to represent the information. In addition, prior to transmitting a modulated signal, information bits may be encoded using an error-correcting code to compensate for errors that may occur during decoding due to noise in a communication channel.

SUMMARY

A communication method includes: receiving input data at a transmitter, the transmitter including at least one convolutional encoder and at least one modulator; applying the input data to a trellis-coded modulation (TCM) scheme to encode the input data and produce one or more TCM symbols representing the encoded data; applying the one or more TCM symbols to a second modulation scheme, the second modulation scheme including a pulse modulation in combination with an additional modulation; and generating one or more modulation symbols representing the encoded data based on the second modulation scheme.

A communication apparatus includes: a carrier configured to be disposed in a borehole in an earth formation; a transmitter disposed at the carrier, the transmitter including a processor in communication with at least one downhole component and in communication with a receiver, the processor configured to: receive input data from the downhole component; apply the input data to a trellis-coded modulation (TCM) scheme to encode the input data and produce one or more TCM symbols representing the encoded data; apply the one or more TCM symbols to a second modulation scheme, the second modulation scheme including a pulse position and/or duration modulation in combination with an additional modulation; and generate one or more modulation symbols representing the encoded data based on the second modulation scheme.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

Apparatuses and methods for downhole communication are described herein, which incorporate communication techniques applicable for communication systems such as cable bound telemetry systems. Trellis coded modulation (TCM) line coding schemes are used in conjunction with a combined pulse modulation scheme in order to increase data transmission rates without requiring additional signal energy. In one embodiment, TCM encoded data is mapped onto a combined pulse modulation scheme. The combined pulse modulation scheme incorporates a pulse modulation with an additional signal modulation such as phase modulation. Methods are provided to protect information bits against transmission errors by jointly optimizing coding and modulation to achieve a signal to noise ratio (SNR) gain.

Figure 1:
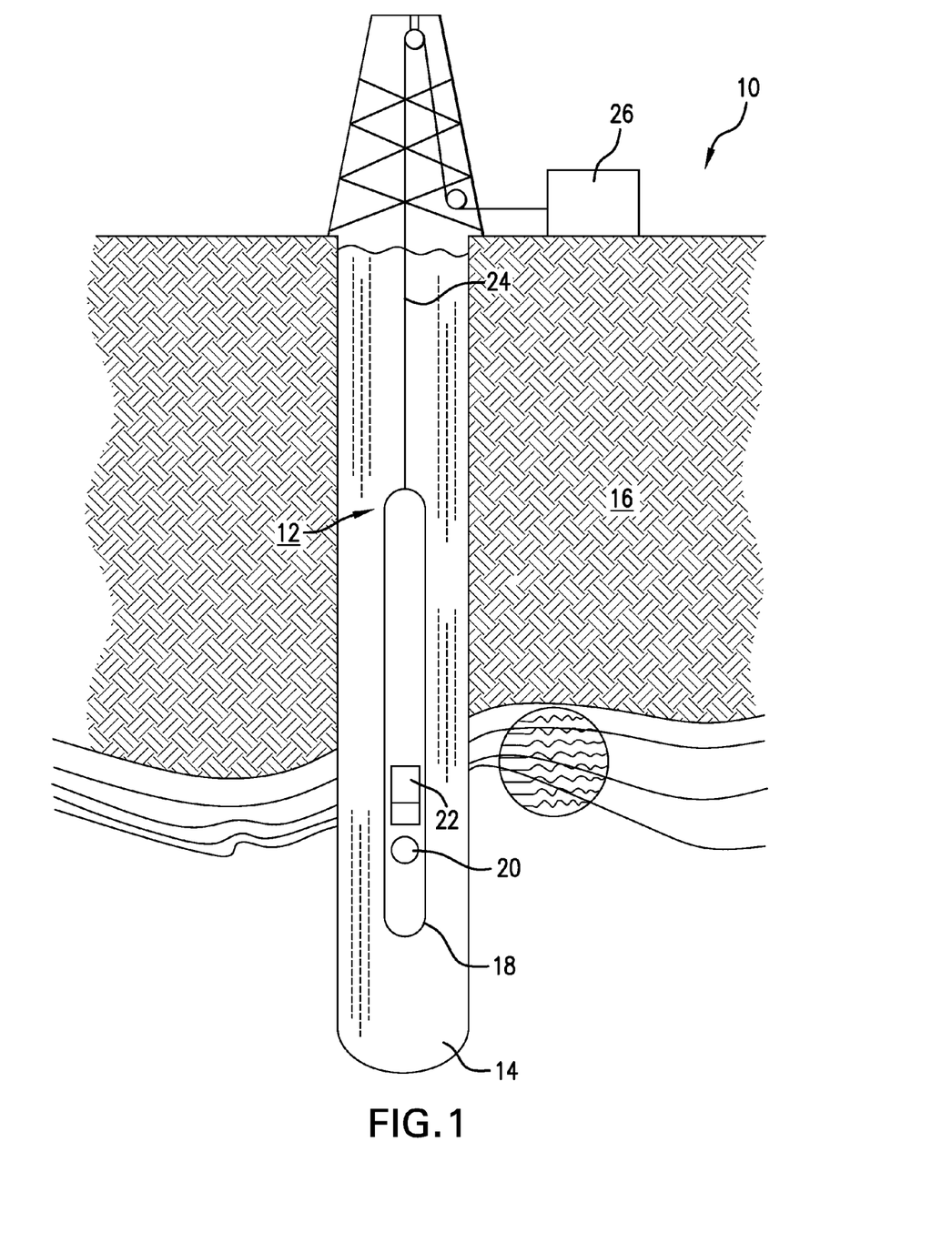
FIG. 1 is a side cross-sectional view of an embodiment of a subterranean well drilling, evaluation, exploration and/or production system.

Referring to FIG. 1, an exemplary embodiment of a subterranean well drilling, evaluation, exploration and/or production system 10 includes a borehole string 12 that is shown disposed in a borehole 14 that penetrates at least one earth formation 16 during a subterranean operation. In one embodiment, the borehole string includes a downhole tool 18 such as a well logging tool. In this example, the downhole tool 18 is a wireline tool, but is not limited thereto. For example, the downhole tool 18 can be incorporated with a drill string for logging-while-drilling (LWD) applications. The downhole tool 18 is not limited to the embodiments described herein, and may be disposed with any suitable carrier. A "carrier" as described herein means any device, device component, combination of devices, media and/or member that may be used to convey, house, support or otherwise facilitate the use of another device, device component, combination of devices, media and/or member. Exemplary non-limiting carriers include drill strings of the coiled tube type, of the jointed pipe type and any combination or portion thereof. Other carrier examples include casing pipes, wirelines, wireline sondes, slickline sondes, drop shots, downhole subs, bottom-hole assemblies (BHAs), and drill strings.

The downhole tool 18 includes and/or is operably connected to various components, such as sensors, electronics, samplers and packers. For example, as shown in FIG. 1, the downhole tool 18 includes at least one sensing and/or measurement assembly 20 configured to estimate properties of the formation 16, the borehole 14 and/or operational properties. Exemplary properties include resistivity, density, porosity, permeability, acoustic properties, nuclear-magnetic resonance properties, formation pressures, properties or characteristics of the fluids downhole and other desired properties of the formation surrounding the borehole 14. The system 10 may further include a variety of other sensors and devices for determining one or more properties of a carrier.

The downhole tool 18 also includes or is operably connected to a communication system having a downhole communication unit including a transmitter and/or receiver, such as a transceiver unit 22. The transceiver unit 22 is connected in communication via, for example, a communication cable 24 (e.g., a fiber optic and/or conductor cable and/or wired drillstring), with a surface communication and/or processing unit 26. Other communication types can also be used, such as BHA bus systems. The surface processing unit 26 also includes a transmitter and/or receiver.

Figure 2:
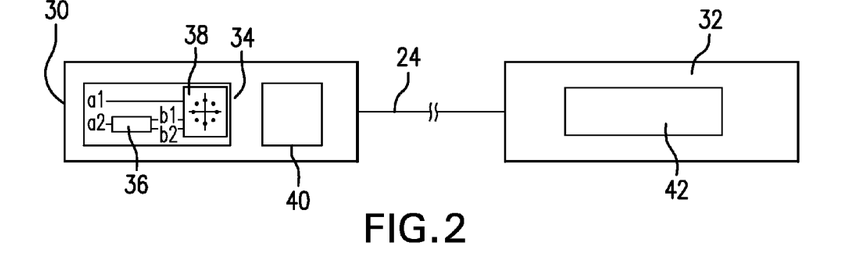
FIG. 2 illustrates an exemplary transmitter and receiver configuration.

FIG. 2 illustrates an exemplary transmitter/receiver configuration that can be incorporated into the system 10. A transmitter 30 is connected in communication with a receiver 32 via a wired connection (e.g., conductor or optical fiber) such as the cable 24.

The transmitter 30 includes processing and transmission components configured to encode incoming digital information and transmit the encoded information via a modulated transmission signal. The encoding and modulation scheme described herein utilizes trellis-coded modulation (TCM) in combination with a "combined pulse modulation" scheme. The combined pulse modulation scheme includes a pulse modulation (e.g., pulse position modulation or PPM) onto which an additional modulation scheme is superimposed.

The transmitter 30 includes a TCM encoder/modulation unit 34 that includes a convolutional encoder 36. The encoder 36 is configured to have a k/n rate, where "k" is the number of input bits and "n" is the number of output bits. The output bits are output to a TCM mapper 38.

TCM is a very efficient way of protecting information bits from transmission errors. To protect information bits from transmission errors the bits are error coded before modulation. This increases the number of bits to be transmitted, thereby reducing either the net data rate or increasing the necessary spectral bandwidth. Traditionally coding and modulation are considered individually as digital and analog functions, respectively. In trellis coded modulation (TCM) the two tasks are combined into one function to maximize the Euclidean distance between code words. TCM systems jointly optimize coding and modulation, and are able to achieve a coding gain compared to traditional communication systems with separated coding and modulation.

TCM includes a convolution code which utilizes parity bits applied to each symbol on a per symbol basis within a continuous data stream, and also includes modulation for data to be transferred over a medium. The technique combines forward error coding with the modulation process for joined optimization. This is fundamentally different from traditional error control coding with separate coding and modulation. Due to an increase of the modulation level (i.e. number of symbols) (K) from K=2^k to K=2^(k+1), no extra spectral bandwidth is necessary and the net data rate does not suffer either.

Schematically, as part of a TCM process, a k-bit word is mapped on a k+1 bit symbol via a convolutional code using a selected trellis diagram and a constellation mapper via a selected modulation type. Various types of trellis diagrams incorporating a selected number of states can be used, as well as various types of modulation. Exemplary modulations include amplitude-shift keying (ASK) schemes such as Quadrature amplitude modulation (QAM), frequency-shift keying (FSK) schemes, and phase-shift keying (PSK) schemes such as Binary phase-shift keying (BPSK), Quadrature phase-shift keying (QPSK) and eight phase-shift keying (8PSK).

As a result of TCM process, the modulation index is increased by 1, e.g. from QPSK (k=2) to 8-PSK (k=3) or from 8-PSK to 16-QAM (k=4). For example, the encoder 36 shown in FIG. 2 is a ½ rate encoder that encodes incoming bits via a four-state trellis, and the coded output is mapped via the mapper 38 to an 8PSK modulation constellation, to produce modulations symbols.

For example, a symbol including two bits a1 and a2 is input into the TCM unit 34. Bit a1 (the most significant bit) is input to the TCM mapper (in this example, an 8PSK mapper) and bit a2 is input to the encoder 36 to be encoded. The encoder 36 produces two bits, b1 and b2, which are input to the TCM mapper 38. The TCM mapper processes the bits a1, b1 and b2 to produce an output signal (e.g., 8PSK), referred to as a TCM output signal, that includes phase changes representing the input symbol.

Referring again to FIG. 2, the transmitter 30 includes a modulation unit 40 configured to receive the TCM output signal and map the signal onto a combined pulse modulation scheme. The modulation unit 40 generates modulation symbols based on the TCM symbols generated by the TCM unit 34, by mapping the TCM symbols onto the combined pulse modulation scheme. The modulation unit 40 is configured to associate the symbols received from the TCM unit and generate a modulated output signal including symbols represented by pulses having both selected position and/or duration, as well as an additional modulation.

The receiver 32 includes a decoder 42 configured to decode the transmitted signal according to any suitable algorithm or procedure, based on the combined modulation scheme. For example, a Viterbi algorithm can be used to decode the modulated output signal from the transmitter 30.

Figure 3:
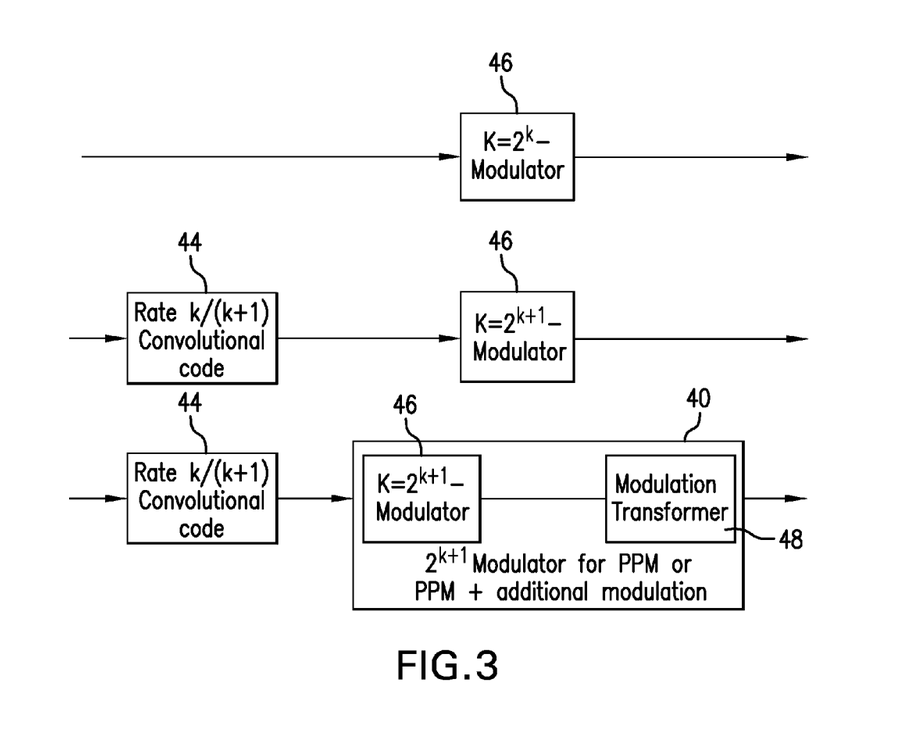
FIG. 3 illustrates exemplary encoder and modulator configurations.

FIG. 3 illustrates an exemplary configuration of transmitter components relative to a standard TCM configuration, which includes a rate k/(k+1) convolutional encoder 44 and a modulator 46, such as a QAM or PSK modulator. In contrast, the encoder 36 is used in conjunction with the modulation unit 40 that includes the modulator 46 and a combined pulse position modulator 48 that maps the TCM symbols to the combined pulse modulation scheme, such as PPM with a superimposed additional modulation of the pulses.

The combined pulse modulation scheme, as indicated above, utilizes pulse modulation (e.g., pulse position modulation or PPM) in combination with an additional modulation scheme to produce modulation symbols for received TCM symbols. The superposition of an additional modulation dimension on top of the pulse modulation can be used to accommodate the increased number of TCM symbols (relative to standard encoding) as the symbol space expands from $2^k$ to $2^{k+1}$ elements. Alternatively, the additional modulation on the top may be used to carry additional payload data.

Figure 4:
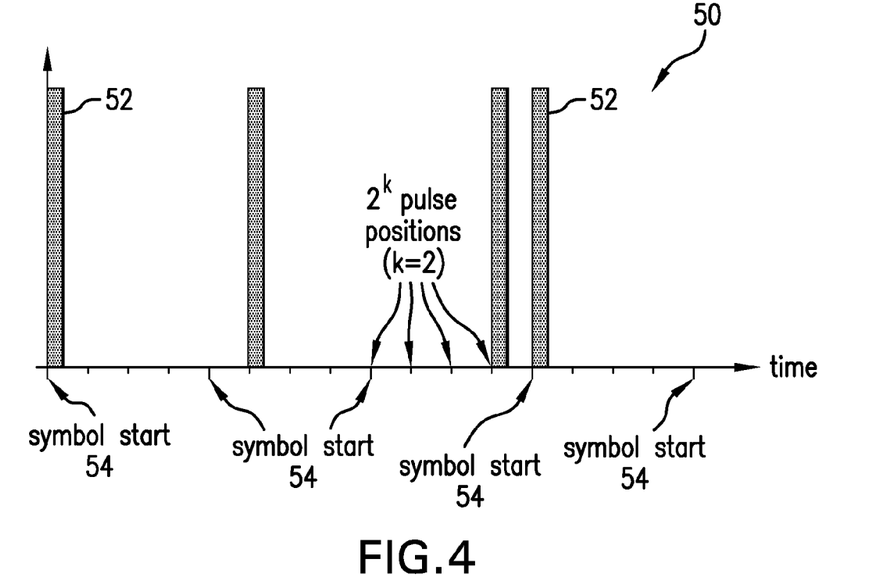
FIG. 4 depicts exemplary symbols for a pulse position modulation (PPM) scheme.

FIG. 4 illustrates an exemplary pulse modulation scheme, referred to as pulse position modulation (PPM). Many pulse position modulation (PPM) schemes represent a bit, or group of bits (i.e. a symbol or word), as a single pulse. The timing information of the pulse carries the information. For binary data, a number "k" of bits are encoded into a single pulse with one of $2^k$ possible time shifts. PPM schemes may also represent a bit (or group of bits) by a single pulse and/or a plurality of pulses (e.g., combinatorial coding). Such PPM schemes can map a bit or a group of bits onto group of pulses.

For modulation of two bits (k=2), a PPM signal 50 includes a number of pulses 52 that can each be temporally located at one of 2^k pulse starting positions 54. Each start position represents a symbol (in this example, a two-bit symbol).

PPM schemes can include symbol-based or word-based schemes. Symbol-based pulse position modulation (PPM) schemes represent a bit, or group of bits (i.e. a symbol), as a single pulse. The timing information of the pulse carries the information. In contrast, word based schemes represent a group of bits, referred to as word, as a group of pulses.

Word based schemes are referred to herein as "combinatorial codes." Combinatorial codes can be categorized according to three parameters. A word is represented by a combination of M pulses in N slots (i.e., time positions), with pulses spaced a minimum of L slots apart. In one embodiment, combinatorial rules require that there must be at least (L−1) vacant slots (slots that do not contain the leading edge of a pulse) between the leading edges of consecutive pulses, and there must be at least (L−1) vacant slots following the leading edge of the last pulse of a word.

Specific pulse widths are not required, although the pulse width is typically set as the minimum space between pulses.

For example, for a minimum number of slots equal to three (L=3), the width of a pulse may be set to 1.5 slots. For L=2, the optimum pulse width may be equal to the slot width. In one embodiment, the optimum pulse width is L/2 slots.

Figure 5:
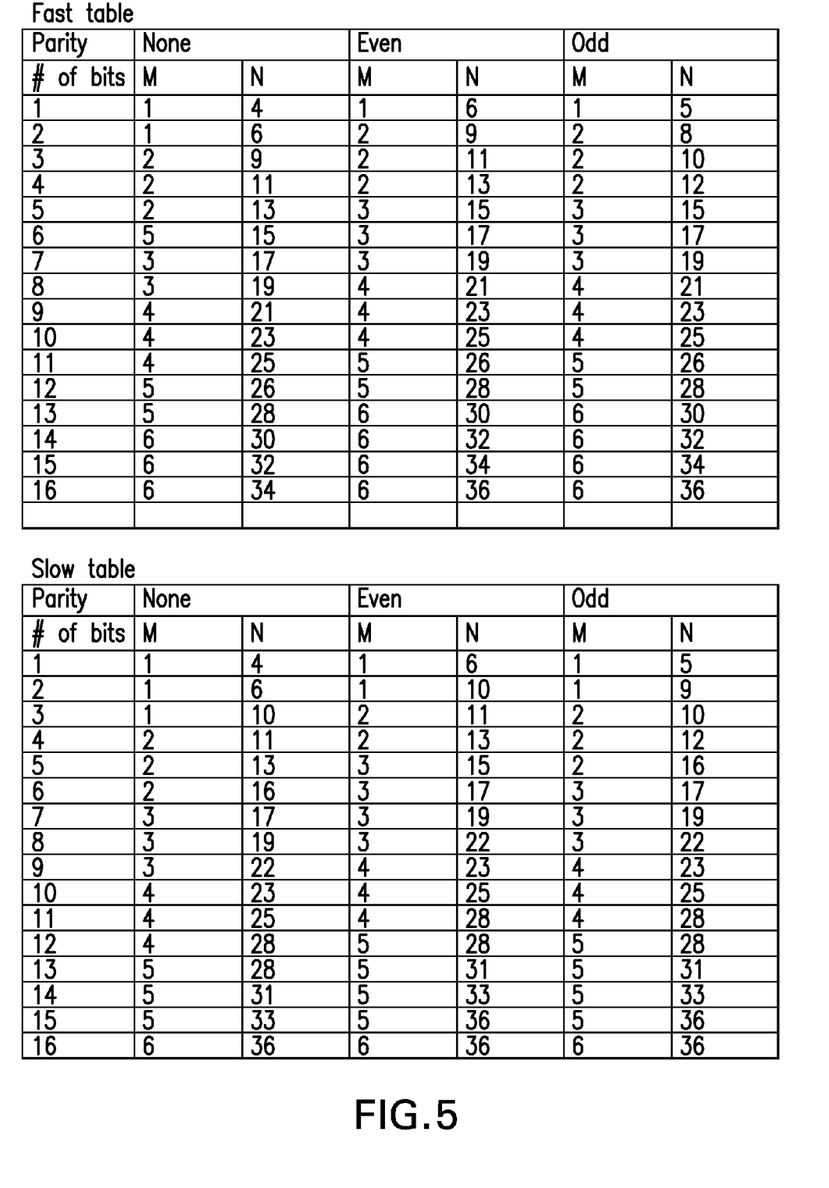
FIG. 5 depicts exemplary fast and slow tables for combinatorial code modulation.

In one embodiment, for a given word length and L value, the optimum values of M and N are computed using the following binomial coefficient C:

$$C\binom{N-(L-1)\cdot M}{M} = \frac{(N-(L-1)\cdot M)_!}{M!\cdot(N-L\cdot M)_!}$$

This is equivalent to log(C)/log(2) bits of information. To encode a word with a length equivalent to an integer number of bits, particular M and N values are selected which can encode the required number of bits in the smallest number of slots (smallest value of N); if this permits more than one combination, that with the smallest M value is selected. Use of the binomial coefficient as described above produces M and N combinations corresponding to an exemplary "Fast Table" (for L=3) shown in FIG. 5. FIG. 5 also illustrates an exemplary "Slow Table" for L=3, primarily for use in instances where data rate is sacrificed in order to make use of a smaller number of pulses.

A further refinement of combinatorial codes is 'combinatorial parity', in which data are encoded using pulses placed in slot positions whose sum must be either odd or even. This helps to detect errors in which a single pulse is decoded in the wrong slot. Prior to the development of combinatorial parity, a measure of error detection could be obtained by adding a parity bit to the end of the word and encoding the result.

Another type of pulse modulation is pulse duration modulation (PDM). Pulse duration modulation encodes the information bits directly into pulse length. In some instances, assuming that the pulse duration of a pulse position modulation scheme is adjusted to the minimum necessary pulse width, pulse duration modulation generally requires more signal energy than pulse position modulation.

Figure 6:
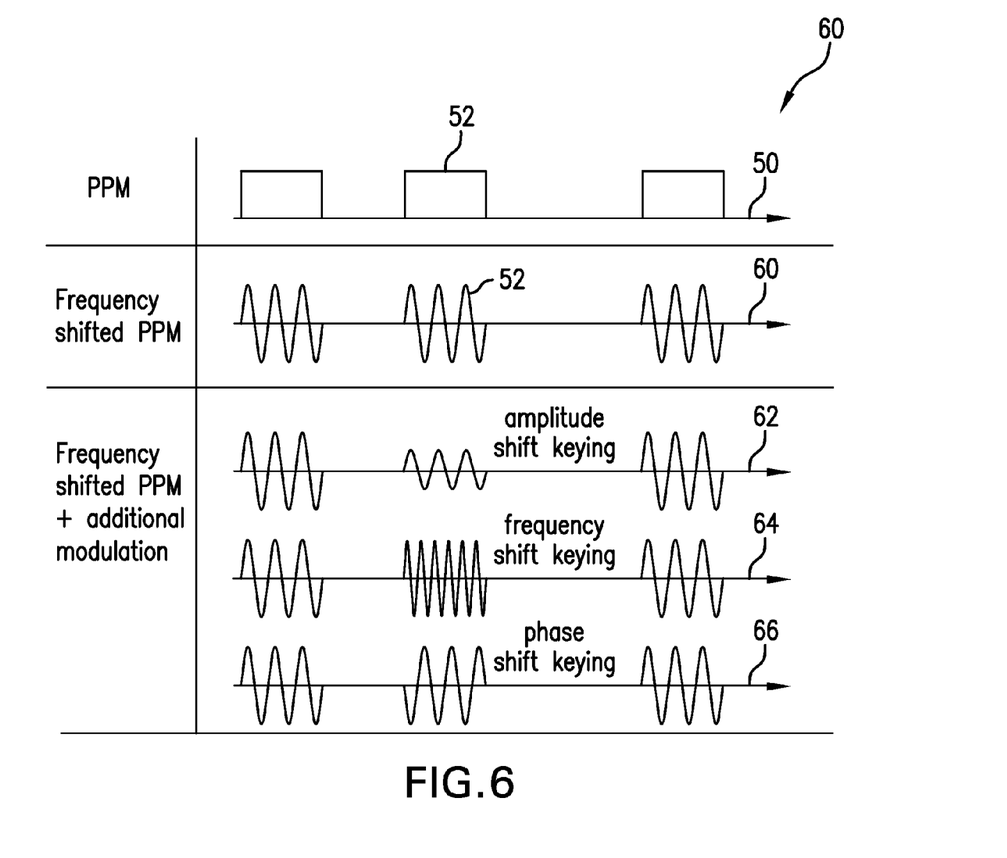
FIG. 6 depicts exemplary symbols for a combined pulse modulation scheme.

Referring to FIG. 6, the combined pulse modulation described herein incorporates pulse modulation with an additional type of modulation. For example, one or more of the pulses can be modulated using amplitude, frequency or phase modulation, so that additional symbols can be represented relative to pulse modulation alone. The additional modulation scheme may be any suitable type of modulation that allows for additional bits to be represented in excess of the number allowable in the pulse modulation scheme alone.

FIG. 6 shows a signal 60 that utilizes frequency shifts to represent the pulses 52. Pulse position modulation of a bit stream results in a series of pulses. For transmission typically the pulses are frequency shifted from baseband to the carrier frequency using on-off keying. Pulse duration and pulse position modulation, whether bit or word based, eventually result in a series of pulses which may be frequency modulated using on-off keying. Imposing further modulation schemes on the frequency shifted pulses can increase the bandwidth of the overall system.

Referring again to FIG. 6, imposing further modulation schemes on the frequency modulated pulses can increase the bandwidth of the overall system. Possible additional modulation dimensions include the amplitude of the oscillation train, an example of which is shown as signal 62. Signals 64 and 66 illustrate examples of modulating the used frequency within a time duration of the pulse (signal 64), and modulating the phase relative to a clock signal (signal 66). In another example, the phase may be modulated relative to the phase of a previous pulse (referred to as differential phase shift keying) or relative to any other arbitrary point in time. A combination of any of these additional modulation schemes may be used with PPM.

The following examples are provided to illustrate the use of a combined pulse modulation scheme in conjunction with TCM. It is noted that the combinations are exemplary and non-limiting; various types of TCM symbols may be used with any of various combinations of pulse modulation and additional modulation.

In one embodiment, the combined pulse modulation scheme utilizes an amplitude modulation such as amplitude shift keying (ASK) as an additional modulation. For example, 8PSK symbols produced by a TCM scheme can be mapped onto a combined modulation scheme that uses a frequency shift to define edges of a pulse. The combined modulations scheme also uses varying amplitudes above the threshold to define a further modulation dimension. Thus, a symbol can be defined based on a position and/or duration of a pulse, the amplitude of the pulse, and a phase shift of the pulse. In this way, three modulation dimensions can be used to define different symbols.

In another embodiment, the combined pulse modulation utilizes a phase modulation scheme such as phase shift keying (PSK) as an additional modulation. For example, amplitude modulated TCM symbols (e.g., QAM) can be mapped onto a pulse position modulation scheme that uses frequency shifting to define the pulses and also uses changes in pulse phase relative to a reference phase (e.g., from a synchronization or clock pulse) or differential phase shifting to define an additional modulation dimension. In this way, amplitude shifting, pulse position and oscillation phase can be interpreted as three dimensions of a modulation scheme.

The combined pulse modulation described herein can also be used with multi-dimensional TCM. Here a number (n) of symbols are processed together resulting in interdependencies of the modulated symbol. This interdependency further increases the system performance. Also this scheme allows the introduction of other code rates than k/(k+1) since n*k bits can be processed at a time.

In one embodiment, in order to cope with various transmission conditions, a number of different protection levels (i.e. code rates) may be specified. In case of difficult transmission, the system may be used with a high protection level (low code rate), whereas in case of an "easy" transmission channel it may be sufficient to run the system with a low protection level (low code rate). Specifying different protection levels will add flexibility to the communication system.

Figure 7:
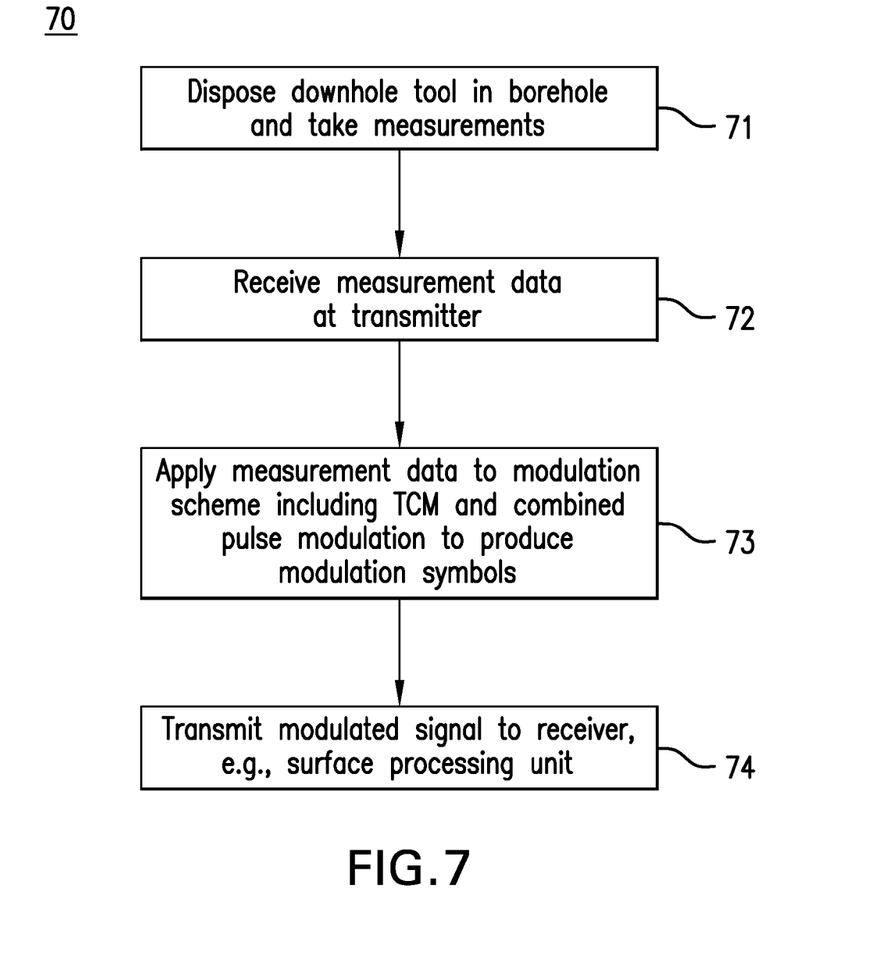
FIG. 7 is a flow chart depicting an exemplary communication method incorporating trellis-coded modulation in conjunction with combined pulse modulation.

FIG. 7 illustrates a method 70 of communication between a signal transmitter and a receiver. In the embodiments described herein, the method 40 is described in conjunction with communication between downhole components or communication between a downhole component and a surface component, e.g., the transceiver 22 and the surface unit 26. However, the method 70 is not so limited, and can be performed in conjunction with any type of downhole or surface communication system that utilizes pulse-based communication. The method 70 includes one or more stages 71-74. In one embodiment, the method 70 includes the execution of all of the stages 71-74 in the order described. However, certain stages may be omitted, stages may be added, or the order of the stages changed.

The method may be used with any cable bound communication or telemetry system such as a wired pipe system, downhole bus systems or downhole sensor networks and be used with electrical conductors and/or fiber optic systems. In addition, the method may be used with other types of communication systems such as wireless systems and mud pulse telemetry systems.

In the first stage 71, the downhole tool 18 is disposed in the borehole 14, and one or more measurements are taken. Measurements may be taken, for example, by one or more sensors disposed at the tool 18.

In one embodiment, the taking of measurements from the tool 18 is recorded in relation to the depth and/or position of the tool 18, which is referred to as "logging", and a record of such measurements is referred to as a "log". Examples of logging processes that can be performed by the system 10 and in conjunction with the methods described herein include measurement-while-drilling (MWD) and logging-while-drilling (LWD) processes. Additional examples of logging processes include logging measurements after drilling, wireline logging, pipe-conveyed logging operations, drop shot logging and memory logging.

In the second stage 72, the transmitter 30 receives data or information from the tool 18 and stores the information as digital signal information, i.e., information bits.

In the third stage 73, the transmitter 30 applies the information bits to an encoding and modulation scheme that includes TCM and a combined pulse modulation. The TCM includes a selected trellis code mapped onto a modulation constellation or signal set. For example, the bits are encoded via a four-state trellis-coded eight-phase (8PSK) modulation. The 8PSK signals are assigned to transitions in a four state trellis. Bits are passed through the trellis encoder, resulting in coded bits that are then mapped to one of the phases of the 8PSK constellation to produced TCM modulation symbols. The TCM symbols are mapped to a combined pulse modulation scheme, e.g., via a transformation. In another example, QAM modulation symbols can be transformed from QAM modulation to the combined pulse modulation (e.g., PPM+PSK).

In the fourth stage 74, the transmitter produces modulation symbols based on application of the information bits to the encoding and modulation scheme, and transmits a modulated signal representing the encoded bits. The modulated signal is transmitted, e.g., to the surface processing unit 26 over the cable 24 (compare FIG. 1 and FIG. 2).

The apparatuses and methods described herein have various advantages over prior art apparatuses and techniques. The apparatuses and methods allow for an increase in the data rate and robustness of communication without changing the transmission bandwidth.

In connection with the teachings herein, various analyses and/or analytical components may be used, including digital and/or analog systems. The system 10, and/or components such as the downhole tool 18, the surface processing unit 26, the transmitter 30 and the receiver 32, may have components such as a processor, storage media, memory, input, output, communications link (wired, wireless, pulsed mud, optical or other), user interfaces, software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

One skilled in the art will recognize that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention.

What is claimed is:

1. A communication method comprising:
receiving input data at a transmitter, the transmitter including at least one convolutional encoder and at least one modulator;
applying the input data to a trellis-coded modulation (TCM) scheme to encode the input data and produce one or more TCM symbols representing the encoded data;
applying the one or more TCM symbols to a second modulation scheme, the second modulation scheme including a pulse modulation in combination with an additional modulation; and
generating one or more modulation symbols representing the encoded data based on the second modulation scheme.

2. The method of claim 1, further comprising transmitting the one or more modulation symbols to a receiver.

3. The method of claim 1, wherein the pulse modulation includes at least one of pulse position modulation (PPM) and pulse duration modulation.

4. The method of claim 1, wherein each modulation symbol includes one or more pulses having selected temporal positions, the one or more pulses being frequency shifted to a carrier frequency.

5. The method of claim 1, wherein each of the one or more modulation symbols is represented by a combination of a first property of a waveform indicating one or more positions and one or more time durations of one or more pulses, and a second property of the waveform within the time duration used for the additional modulation.

6. The method of claim 5, wherein the additional modulation is selected from at least one of amplitude-shift keying (ASK), phase-shift keying (PSK) and frequency-shift keying (FSK).

7. The method of claim 1, wherein applying the input data to the TCM scheme includes feeding information bits into a convolutional encoder and a modulation constellation mapper to produce the one or more TCM symbols.

8. The method of claim 7, wherein applying the one or more TCM symbols to a second modulation scheme includes feeding the TCM symbols to at least one modulator.

9. The method of claim 1, wherein the transmitter is disposed at a carrier configured to be disposed in an earth formation.

10. The method of claim 9, further comprising transmitting the one or more modulation symbols from the transmitter to a receiver via a wired connection.

11. A communication apparatus comprising:
a carrier configured to be disposed in a borehole in an earth formation;
a transmitter disposed at the carrier, the transmitter including a processor in communication with at least one downhole component and in communication with a receiver, the processor configured to:
receive input data from the downhole component;
apply the input data to a trellis-coded modulation (TCM) scheme to encode the input data and produce one or more TCM symbols representing the encoded data;
apply the one or more TCM symbols to a second modulation scheme, the second modulation scheme including a pulse modulation in combination with an additional modulation; and
generate one or more modulation symbols representing the encoded data based on the second modulation scheme.

12. The apparatus of claim 11, wherein the pulse modulation includes at least one of pulse position modulation (PPM) and pulse duration modulation.

13. The apparatus of claim 11, wherein each modulation symbol includes one or more pulses having selected temporal positions, the one or more pulses being frequency shifted to a carrier frequency.

14. The apparatus of claim 11, wherein each of the one or more modulation symbols is represented by a combination of a first property of a waveform indicating one or more positions and one or more time durations of one or more pulses, and a second property of the waveform within the time duration used for the additional modulation.

15. The apparatus of claim 14, wherein the additional modulation is selected from at least one of amplitude-shift keying (ASK), phase-shift keying (PSK) and frequency-shift keying (FSK).

16. The apparatus of claim 1, wherein the processor is configured to apply the input data to the TCM scheme by feeding information bits into a convolutional encoder and a modulation constellation mapper to produce the one or more TCM symbols.

17. The apparatus of claim 16, wherein the processor is configured to apply the one or more TCM symbols to a second modulation scheme by feeding the TCM symbols to at least one modulator.

18. The apparatus of claim 11, wherein the transmitter is configured to transmit the one or more modulation symbols from the transmitter to a receiver via a wired connection.

19. The apparatus of claim 18, wherein the receiver is disposed in at least one of a remote downhole component and a surface processing unit.

20. The apparatus of claim 11, wherein the downhole component includes a sensing apparatus configured to measure a parameter of at least one of the downhole component, the borehole and the earth formation.

\* \* \* \* \*